United States Patent
Nakano

(10) Patent No.: US 10,932,365 B2
(45) Date of Patent: Feb. 23, 2021

(54) FLEXIBLE WIRING BOARD AND DISPLAY DEVICE

(71) Applicant: JOLED INC., Tokyo (JP)

(72) Inventor: Yutaka Nakano, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/456,431

(22) Filed: Jun. 28, 2019

(65) Prior Publication Data
US 2020/0053878 A1  Feb. 13, 2020

(30) Foreign Application Priority Data

Aug. 8, 2018 (JP) .............................. JP2018-149189

(51) Int. Cl.
*H05K 1/00* (2006.01)
*H05K 1/11* (2006.01)
*H05K 1/18* (2006.01)

(52) U.S. Cl.
CPC ............ *H05K 1/118* (2013.01); *H05K 1/189* (2013.01); *H05K 2201/0769* (2013.01); *H05K 2201/094* (2013.01); *H05K 2201/09781* (2013.01); *H05K 2201/10128* (2013.01)

(58) Field of Classification Search
USPC ......................................................... 361/749
See application file for complete search history.

(56) References Cited

U.S. PATENT DOCUMENTS

2007/0195763 A1* 8/2007 Onodera ................ H05K 3/361
                                                          370/389
2016/0133587 A1* 5/2016 Lee .................... H01L 23/49541
                                                          257/773

FOREIGN PATENT DOCUMENTS

JP          11-135909       5/1999
JP          2002-215059     7/2002
JP          2002-329941     11/2002

OTHER PUBLICATIONS

Office Action issued in Japan patent application No. 2018-149189, dated Jun. 30, 2020, together with an English language translation thereof.

* cited by examiner

*Primary Examiner* — Andargie M Aychillhum
(74) *Attorney, Agent, or Firm* — Greenblum & Bernstein, P.L.C.

(57) ABSTRACT

A flexible wiring board (a first wiring board) includes: an insulating substrate which is flexible; a first terminal which is conductive and is disposed on the insulating substrate; a second terminal which is conductive and is disposed on the insulating substrate; and a no-connection (NC) terminal which is conductive and is disposed on the insulating substrate between the first terminal and the second terminal. The first terminal, the NC terminal, and the second terminal are arranged at a uniform pitch in an arranging direction that is predetermined, and a width of the NC terminal in the arranging direction is smaller than a width of the first terminal in the arranging direction and a width of the second terminal in the arranging direction.

6 Claims, 9 Drawing Sheets

FLEXIBLE WIRING BOARD AND DISPLAY DEVICE

CROSS REFERENCE TO RELATED APPLICATION

The present application is based on and claims priority of Japanese Patent Application No. 2018-149189 filed on Aug. 8, 2018. The entire disclosure of the above-identified application, including the specification, drawings and claims is incorporated herein by reference in its entirety.

FIELD

The present disclosure relates to a flexible wiring board, and a display device which includes the flexible wiring board.

BACKGROUND

Conventionally, a display panel using, for example, an organic electroluminescent (EL) panel, is connected, via a flexible wiring board, with a printed circuit board which supplies a voltage and the like to a plurality of pixel circuits arranged in a matrix in the display panel (for example, Patent Literature (PTL) 1). A terminal of such a flexible wiring board and a terminal of a display panel are connected using an anisotropic conductive film (ACF), for example. In this case, the flexible wiring board having two terminals each of which a different voltage is applied includes a no-connection (NC) terminal that is maintained in a floating state and is disposed between the two terminals. This prevents a deterioration of insulation between the two terminals caused by ion migration.

CITATION LIST

Patent Literature

PTL 1: Japanese Unexamined Patent Application Publication No. 2002-329941

SUMMARY

Technical Problem

There is a demand for thinning and lightening of the display device which is described in PTL 1, and includes a printed circuit board, a flexible wiring board, and a display. In order to make the display device described in PTL 1 thinner and lighter, a means of replacing the combination of the printed circuit board and the flexible wiring board with a single flexible wiring board can be considered.

When such a means is used, it increases a tolerance of the flexible wiring board because the size of the flexible wiring board increases. This may increase the displacement of a terminal of the flexible wiring board which is connected with a terminal of the display panel. Because of this, the two terminals which are included in the flexible wiring board and each of which a different voltage is applied are short-circuited via the NC terminal.

The present disclosure has been conceived in view of the above problems, and provides a flexible wiring board and the like which can reduce occurrences of short circuits between terminals.

Solution to Problem

In order to provide such a flexible wiring board and the like, a flexible wiring board according to an aspect of the present disclosure includes: an insulating substrate which is flexible; a first terminal which is conductive and is disposed on the insulating substrate; a second terminal which is conductive and is disposed on the insulating substrate; and a no-connection (NC) terminal which is conductive and is disposed on the insulating substrate between the first terminal and the second terminal, wherein the first terminal, the NC terminal, and the second terminal are arranged at a uniform pitch in an arranging direction that is predetermined, and a width of the NC terminal in the arranging direction is smaller than a width of the first terminal in the arranging direction and a width of the second terminal in the arranging direction.

Furthermore, in order to provide such a flexible wiring board and the like, a flexible wiring board according to an aspect of the present disclosure is a flexible wiring board that is connected with a display panel, wherein the display panel includes: a first panel terminal that is conductive; a second panel terminal that is conductive; and a panel no-connection (NC) terminal which is conductive and is disposed between the first panel terminal and the second panel terminal, and the first panel terminal, the panel NC terminal, and the second panel terminal are arranged at a uniform pitch in an arranging direction that is predetermined, and the flexible wiring board includes: an insulating substrate which is flexible; a first terminal which is conductive and is disposed on the insulating substrate, the first terminal being connected with the first panel terminal; and a second terminal which is conductive and is disposed on the insulating substrate, the second terminal being connected with the second panel terminal, and the flexible wiring board includes a surface between the first terminal and the second terminal, the surface being entirely formed using an insulating material.

Moreover, in order to provide such a flexible wiring board and the like, a display device according to an aspect of the present disclosure includes: the above-described flexible wiring board; and the display panel.

Advantageous Effects

According to the present disclosure, it is possible to provide a flexible wiring board and the like which can reduce occurrences of short circuits between adjacent terminals.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Hereinafter, embodiments according to the present disclosure will be described with reference to the drawings. The embodiments described below show specific examples according to the present disclosure. Therefore, the numerical values, shapes, materials, structural elements, the arrangement and connection of the structural elements, processes, the order of the processes, and the like described in the following embodiments are mere examples, and thus are not intended to limit the present disclosure. Accordingly, among the elements in the following exemplary embodiments, elements not recited in any of the independent claims defining the broadest concept of the present disclosure are described as optional elements.

Note that the drawings are schematic diagrams, and do not necessarily provide strictly accurate illustration. Throughout the drawings, the same sign is given to substantially the same configuration, and redundant description is omitted or simplified.

Embodiment 1

A flexible wiring board and a display device according to Embodiment 1 will be described.

1-1. Whole Configuration of Display Device

First, a whole configuration of a display device according to this embodiment will be described with reference to FIG. 1.

Figure 1:
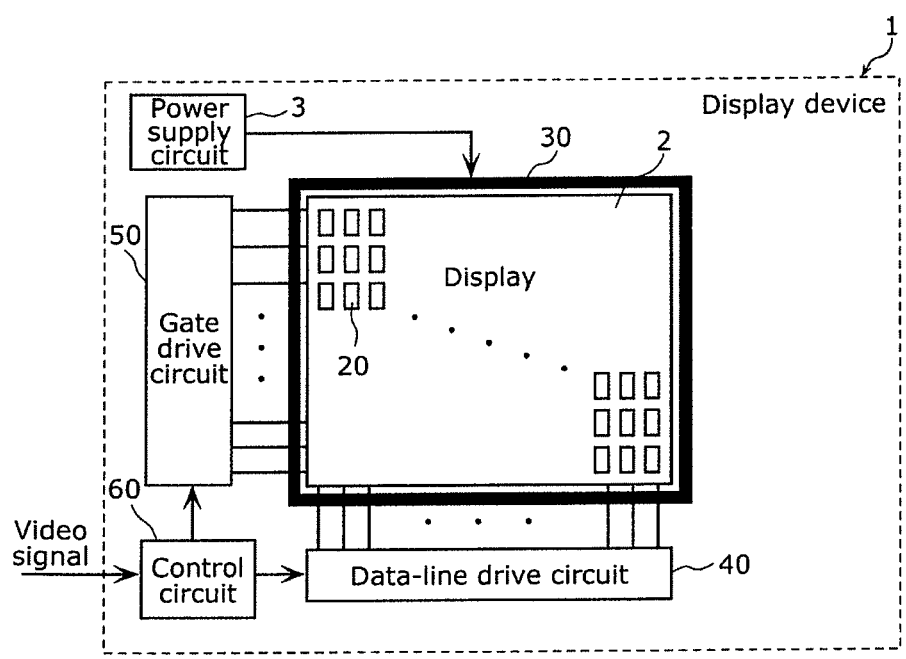
FIG. 1 is a functional block diagram illustrating a whole configuration of a display device according to Embodiment 1.

FIG. 1 is a functional block diagram illustrating a whole configuration of a display device 1 according to the embodiment.

The display device 1 according to the embodiment is a device which displays an image based on a video signal. As illustrated in FIG. 1, the display device 1 includes, as functions, a display 2, a power supply circuit 3, a data-line drive circuit 40, a gate drive circuit 50, and a control circuit 60.

The display 2 is a display panel in which a plurality of pixel circuits 20 each of which includes a light emitting element and a circuit element for driving the light emitting element to emit light are arranged in a matrix. Luminance of the light emitting element changes according to a current supplied to the emitting element. As the light emitting element, for example, an organic electroluminescent (EL) element, a micro light-emitting diode (LED) element, and the like can be used.

The power supply circuit 3 is a circuit which outputs a power supply voltage to be supplied to the display panel (not illustrated in FIG. 1) which includes the plurality of the pixel circuits 20. The power supply circuit 3 supplies a power supply voltage to each of the plurality of the pixel circuits 20 through a feeder 30 disposed along an outer periphery of the display 2. Note that the feeder 30 includes a plurality of power supply lines each of which supplies a different voltage to each of the plurality of the pixel circuits 20. In this embodiment, the power supply circuit 3 is realized by an integrated circuit (IC) chip.

The control circuit 60 is a circuit which supplies, to the display panel, a gradation signal corresponding to a video signal that is input. In this embodiment, the control circuit 60 controls the data-line drive circuit 40 and the gate drive circuit 50. The control circuit 60 generates, based on a video signal externally input, a gradation signal corresponding to the luminance of each of the plurality of the light emitting elements, and outputs the gradation signal that is generated to the data-line drive circuit 40.

In addition, the control circuit 60 generates, based on a synchronized signal that is input, a control signal for controlling the gate drive circuit 50, and outputs the control signal that is generated to the data-line drive circuit 40 and the gate drive circuit 50. Specifically, the control circuit 60 includes a central processing unit (CPU) and a timing controller. In the control circuit 60, the CPU controls the timing controller based on the synchronized signal input for the timing controller to output the control signal to the data-line drive circuit 40 and the gate drive circuit 50. In this embodiment, the control circuit 60 is realized by an IC chip.

The data-line drive circuit 40 drives a data line of the display 2 based on a gradation signal generated in the control circuit 60. More specifically, the data-line drive circuit 40 outputs, based on a video signal and a horizontal synchronizing signal, a video signal voltage (data voltage) which has reflected the video signal to each of the plurality of the pixel circuits 20.

The gate drive circuit 50 drives a scan line of the display 2 based on a control signal generated in the control circuit 60, for example. More specifically, the gate drive circuit 50 outputs, based on a vertical synchronizing signal and a horizontal synchronizing signal, a scan signal and the like to each of the plurality of the pixel circuits 20 per at least display line.

1-2. Circuit Board

Figure 2:
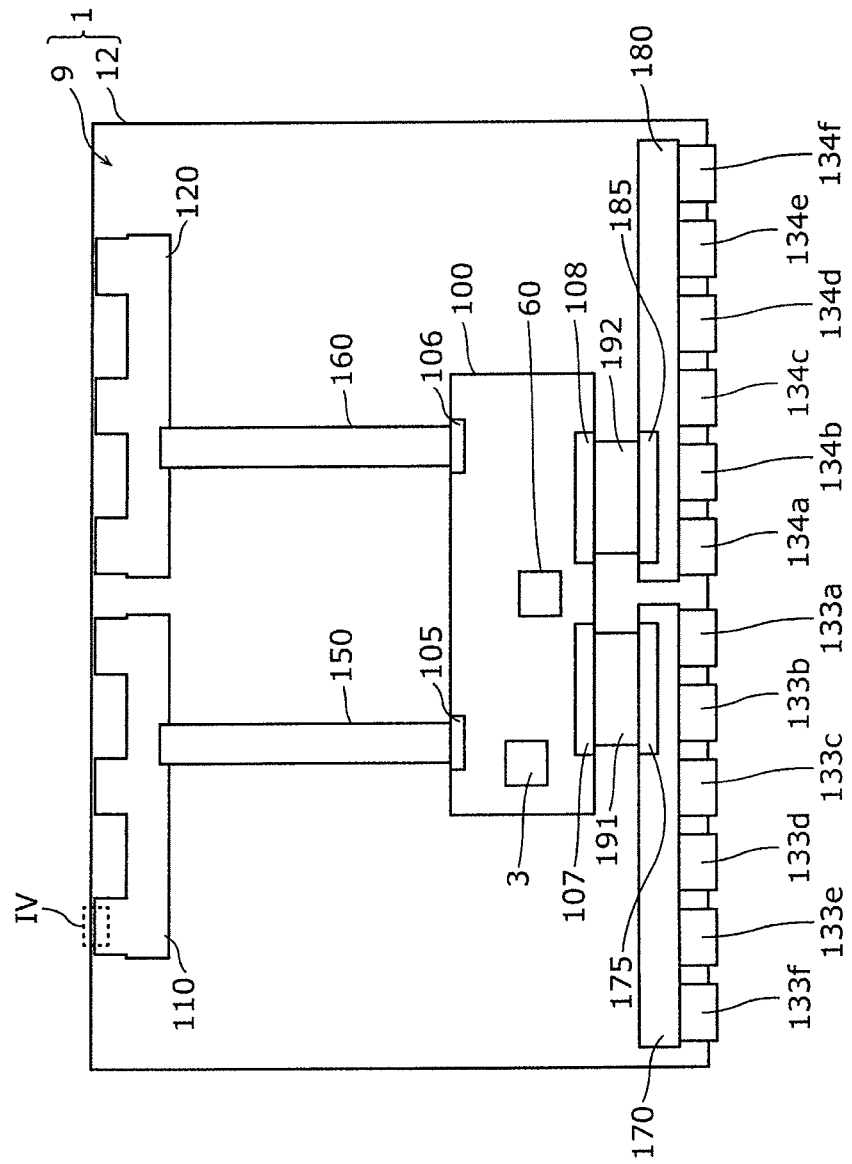
FIG. 2 is a schematic diagram illustrating a configuration of a circuit board of the display device according to Embodiment 1.

A circuit board which is included in the display device 1 according to the embodiment will be described with reference to FIG. 2. FIG. 2 is a schematic diagram illustrating a configuration of a circuit board 9 of the display device 1 according to the embodiment. FIG. 2 illustrates the back side of the display surface of the display device 1.

As illustrated in FIG. 2, the display device 1 according to the embodiment includes, as a structure, the circuit board 9 and a display panel 12.

The display panel 12 includes the plurality of pixel circuits 20 illustrated in FIG. 1. In this embodiment, the display panel 12 includes the display 2, the data-line drive circuit 40, and the gate drive circuit 50 which are illustrated in FIG. 1.

The circuit board 9 is a board which supplies a power supply voltage to the display panel 12 that includes the plurality of pixel circuits 20. As illustrated in FIG. 2, the circuit board 9 includes a power supply wiring board 100, a first wiring board 110, a second wiring board 120, a first cable 150, a second cable 160, and a short-circuit cable 140. In this embodiment, the circuit board 9 further includes first connection boards 131a to 131c, second connection boards 132a to 132c, a first video cable 191, a second video cable 192, a first video wiring board 170, a second video wiring board 180, first video connection boards 133a to 133f, and second video connection boards 134a to 134f.

The power supply wiring board 100 is a board that includes a power supply circuit 3 which outputs a power supply voltage and the control circuit 60. In this embodiment, the power supply wiring board 100 is realized by a printed circuit board, and includes two integrated circuit (IC) chips. One of the IC chips corresponds to the power-supply circuit 3, and the other of the IC chips corresponds to a control circuit 60. In addition, the power supply wiring board 100 includes connectors 105, 106, 107, and 108 with which the first cable 150, the second cable 160, the first video cable 191, and the second video cable 192 are connected, respectively. Note that, although not illustrated, the power supply wiring board 100 further includes other lines, such as a line that connects the control circuit 60 with the connector 107 and a line that connects the control circuit 60 with and the connector 108, and a power supply IC and the like that supply power to the control circuit 60.

The first wiring board 110 is an example of the flexible wiring board according to the embodiment which includes a line to which a power supply voltage is applied. In this embodiment, the first wiring board 110 is realized by a flexible printed circuit (FPC). The first wiring board 110 is connected with the first cable 150. The first cable 150 is connected with the first wiring board 110 using an ACF, for example. The first wiring board 110 may include a line to which a signal different from a power source voltage is applied printed on the first wiring board 110. The first wiring board 110 is connected with the display panel 12. A configuration of a connection between the first wiring board 110 and the display panel 12 will be described later.

The second wiring board 120 is an example of the flexible wiring board according to the embodiment which includes a line to which a power supply voltage is applied. In this embodiment, the second wiring board 120 is realized by an FPC. The second wiring board 120 is connected with the second cable 160. The second cable 160 is connected with the second wiring board 120 using an ACF, for example. The second wiring board 120 may include a line to which a signal different from a power source voltage is applied printed on the second wiring board 120. The second wiring board 120 is connected with the display panel 12. A configuration of a connection between the second wiring board 120 and the display panel 12 will be described later.

The first cable 150 is a cable which connects the power supply wiring board 100 and the first wiring board 110. The first cable 150 may be a flexible (that is, having flexibility), flat plate-shaped cable which includes a plurality of conductors that form the core line of the first cable 150. The first cable 150 is realized by, for example, a flexible flat cable (FFC).

The second cable 160 is a cable that connects the power supply wiring board 100 and the second wiring board 120. The second cable 160 may be a flexible, flat plate-shaped cable which includes a plurality of conductors that form the core line of the first cable 160. The second cable 160 is realized by, for example, an FFC.

The first video cable 191 is a cable which connects the power supply wiring board 100 and the first video wiring board 170, and to which a gradation signal which the control circuit 60 outputs is applied. In addition, a control signal which the control circuit 60 outputs may be applied to the first video cable 191. The first video cable 191 may be a flexible, flat plate-shaped cable which includes a plurality of conductors that form the core line of the first video cable 191. The first video cable 191 is realized by, for example, an FFC.

The second video cable 192 is a cable which connects the power supply wiring board 100 and the second video wiring board 180, and to which a gradation signal which the control circuit 60 outputs is applied. In addition, a control signal which the control circuit 60 outputs may be applied to the second video cable 192. The second video cable 192 may be a flexible, flat plate-shaped cable which includes a plurality of conductors that form the core line of the second video cable 192. The second video cable 192 is realized by, for example, an FFC.

The first video wiring board 170 is a board to which a gradation signal which the control circuit 60 outputs is applied. A control signal which the control circuit 60 outputs may be applied to the first video wiring board 170. In this embodiment, the first video wiring board 170 is realized by a printed circuit board, and includes a connector 175. The connector 175 is connected with the first video cable 191.

The second video wiring board 180 is a board to which a gradation signal which the control circuit 60 outputs is applied. A control signal which the control circuit 60 outputs may be applied to the second video wiring board 180. In this embodiment, the second video wiring board 180 is realized by a printed circuit board, and includes a connector 185. The connector 185 is connected with the second video cable 192.

The first video connection boards 133a to 133f are flexible wiring boards which connect the first video wiring board 170 and the display panel 12. The first video connection boards 133a to 133f may be flexible, flat plate-shaped boards each of which includes a plurality of conductors that form the core line of the board. Each of the first video connection boards 133a to 133f is realized by, for example, an FPC. Each of the first video connection boards 133a to 133f is connected with the first video wiring board 170 and the display panel 12 using, for example, an ACF.

The second video connection boards 134a to 134f are flexible wiring boards which connect the second video wiring board 180 and the display panel 12. The second video connection boards 134a to 134f may be flexible, flat plate-shaped boards each of which includes a plurality of conductors that form the core line of the board. Each of the second video connection boards 134a to 134f is realized by, for example, an FPC. Each of the second video connection boards 134a to 134f is connected with the second video wiring board 180 and the display panel 12 using, for example, an ACF.

Figure 3:
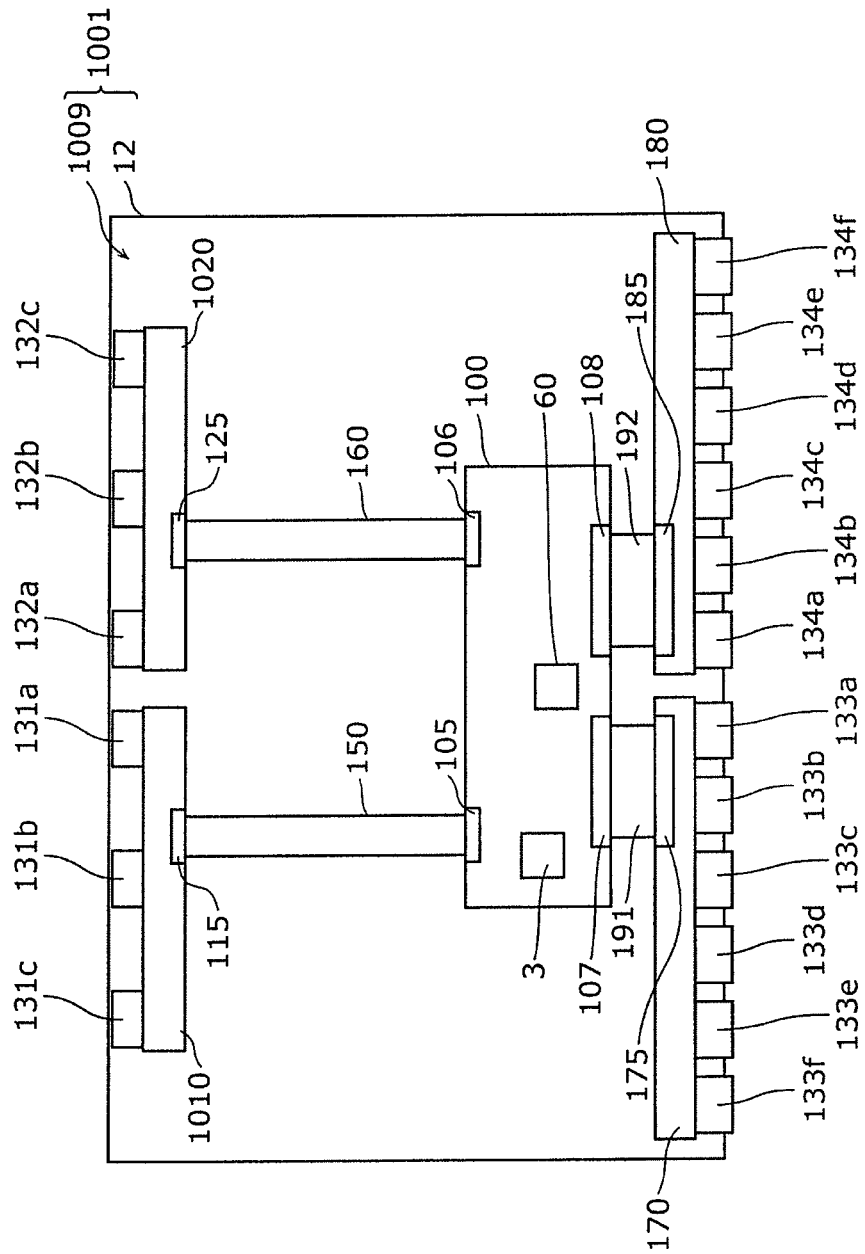
FIG. 3 is a schematic diagram illustrating a configuration of a circuit board of a display device according to comparative example 1.

An effect of the circuit board 9 according to the embodiment will be described with reference to FIG. 3. FIG. 3 is a schematic diagram illustrating a configuration of a circuit board 1009 of a display device 1001 according to comparative example 1. FIG. 3 illustrates the back side of the display surface of the display device 1001.

As illustrated in FIG. 3, the display device 1001 according to comparative example 1 includes, as a structure, the circuit board 1009 and a display panel 12. Note that the configuration of the circuit board 1009 according to comparative example 1 and the configuration of the circuit board 9 according to the embodiment are the same, except for, mainly, the configurations of a first wiring board 1010 and a second wiring board 1020. The first wiring board 1010 and the second wiring board 1020 according to comparative example 1 are rigid printed circuit boards, in other words, inflexible circuit boards, and this is the point where the first wiring board 1010 and the second wiring board 1020 are different from the first wiring board 110 and the second wiring board 120 according to the embodiment. In addition, the first wiring board 1010 according to comparative example 1 is connected with the flexible first connection boards 131a to 131c, and the second wiring board 1020 according to comparative example 1 is connected with the second connection boards 132a to 132c, accordingly. The first wiring board 1010 according to comparative example 1 is connected with the display panel 12 via the first connection boards 131a to 131c, and the second wiring board 1020 according to comparative example 1 is connected with the display panel 12 via the second connection boards 132a to 132c. In addition, the first wiring board 1010 according to comparative example 1 includes a connector 115 for connecting the first wiring board 1010 with the first cable 150. The second wiring board 1020 according to comparative example 1 includes a connector 125 for connecting the second wiring board 1020 with the second cable 160.

As described above, the circuit board 1009 has a complex configuration, and even includes additional structural elements, such as the connectors 115 and 125. On the contrary, since the first wiring board 110 and the second wiring board 120 which are included in the display device 1 according to the embodiment are directly connectable to the display panel 12 without a need for a connector and the like, it is possible to make the display device 1 according to the embodiment thinner and lighter than the display device 1001 according to comparative example 1 is.

1-3. Configuration of Terminal of Flexible Wiring Board

Figure 4:
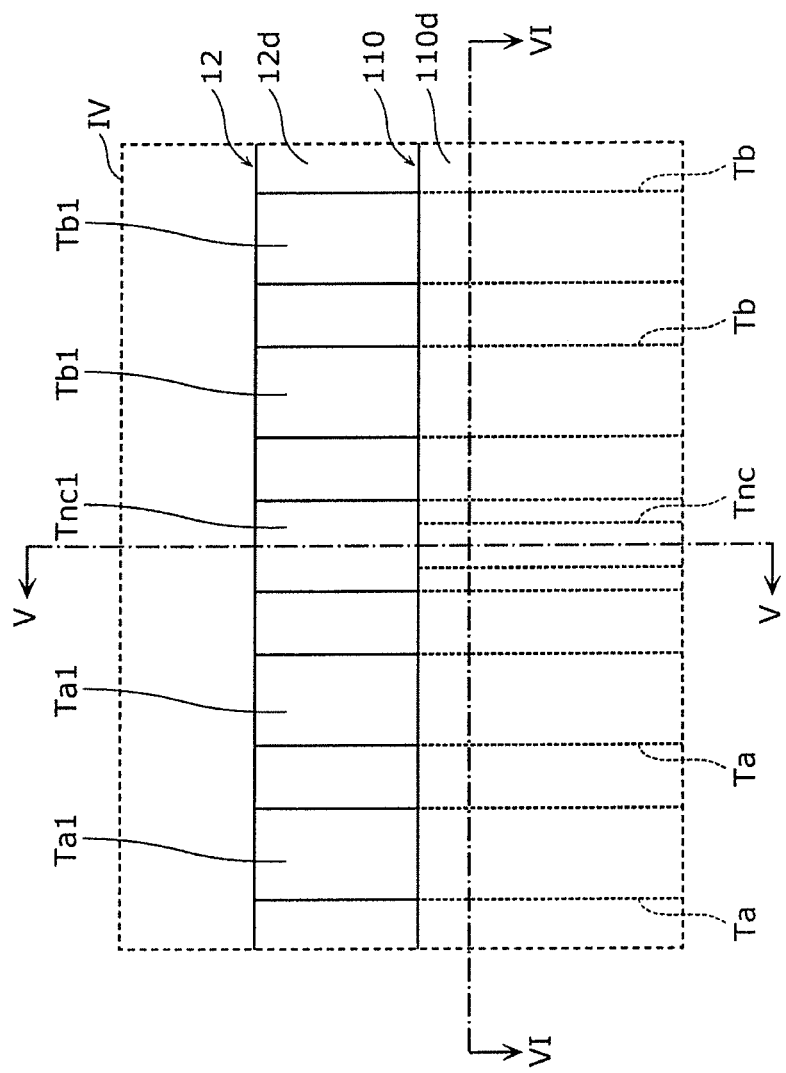
FIG. 4 is a schematic diagram illustrating a configuration of a connecting portion in which a first wiring board and a display panel according to Embodiment 1 are connected.
Figure 5:
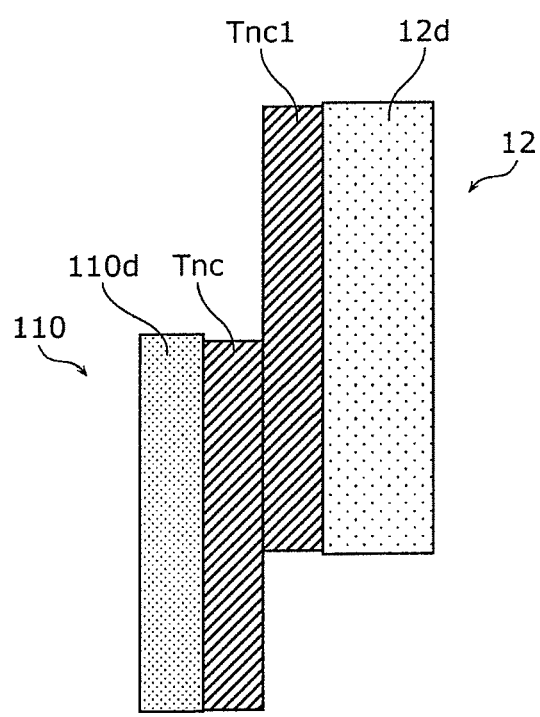
FIG. 5 is a first schematic cross sectional view illustrating the connecting portion in which the first wiring board and the display panel according to Embodiment 1 are connected.
Figure 6:
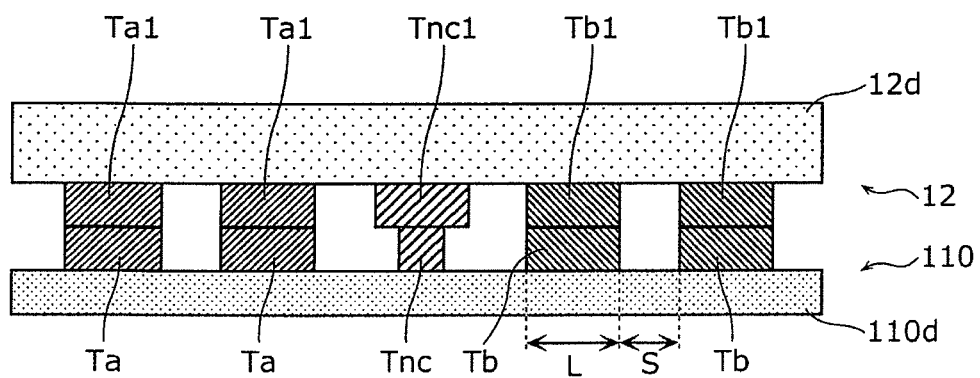
FIG. 6 is a second schematic cross sectional view illustrating the connecting portion in which the first wiring board and the display panel according to Embodiment 1 are connected.

A configuration of a terminal of a flexible wiring board, such as the first wiring board 110 according to the embodiment, will be described with reference to FIG. 4 through FIG. 6. FIG. 4 is a schematic diagram illustrating a configuration of a connecting portion in which the first wiring board 110 and the display panel 12 according to the embodiment are connected. FIG. 4 is an enlarged view of the inside of a broken-line frame IV illustrated in FIG. 2. FIG. 5 and FIG. 6 are schematic cross sectional views illustrating the connecting portion in which the first wiring board 110 and the display panel 12 according to the embodiment are connected. FIG. 5 and FIG. 6 each illustrate a cross-section taken along the line V-V shown in FIG. 4 and along the line VI-VI shown in FIG. 4, respectively.

As illustrated in FIG. 4 and FIG. 6, the first wiring board 110 according to the embodiment includes an insulating substrate 110d that is flexible, a first terminal Ta which is conductive and is disposed on the insulating substrate 110d, a second terminal Tb which is conductive and is disposed on the insulating substrate 110d, an NC terminal Tnc which is conductive and is disposed on the insulating substrate 110d between the first terminal Ta and the second terminal Tb.

The insulating substrate 110d includes a thin film insulating material. A material included in the insulating substrate 110d is not particularly limited, so long as it is a flexible insulating material. For example, polyimide can be used as a material to form the insulating substrate 110d. In addition, the insulating substrate 110d has a thickness of about 10 μm to 100 μm, for example.

The first terminal Ta is a terminal to which a first voltage to be applied to the plurality of pixel circuits 20 included in the display 2 is applied. In the embodiment, the first voltage is applied to the first terminal Ta from the power supply circuit 3 via the first cable 150.

The second terminal Tb is a terminal to which a second voltage to be applied to the plurality of pixel circuits 20 included in the display 2 is applied. The second voltage is different from the first voltage. In the embodiment, the second voltage is applied to the second terminal Tb from the power supply circuit 3 via the second cable 160.

The NC terminal Tnc is a terminal which is maintained in a floating state.

The first terminal Ta, the second terminal Tb, and the NC terminal Tnc are long conductors. In the embodiment, these terminals are thin film conductors which are disposed on the insulating substrate 110d. Each terminal is formed by, for example, etching a copper foil or the like disposed on the insulating substrate 110d.

The first terminal Ta, the second terminal Tb, and the NC terminal Tnc are arranged at a uniform pitch in an arranging direction that is predetermined. That is to say, the center-to-center distance between adjacent terminals in the arranging direction is uniform. In the embodiment, the first terminals Ta, the second terminals Tb, and the NC terminal Tnc are arranged in a direction along an edge of the insulating substrate 110d. That is, the first terminals Ta, the second terminals Tb, and the NC terminal Tnc are arranged in a direction that intersects with the lengthwise direction of the terminals. In addition, the first wiring board 110 includes a plurality of the first terminals Ta, a plurality of the second terminals Tb, and an NC terminal Tnc arranged between the plurality of the first terminals Ta and the plurality of the second terminals Tb. The plurality of the first terminals Ta, the plurality of the second terminals Tb, and the NC terminal Tnc are arranged at the uniform pitch in the arranging direction.

The width of the NC terminal Tnc in the arranging direction is smaller than the width of the first terminal Ta in the arranging direction and the width of the second terminal Tb in the arranging direction. In addition, the width of the NC terminal Tnc in the arranging direction is less than half the pitch at which the plurality of the first terminals Ta, the plurality of the second terminals Tb, and the NC terminal Tnc are arranged. Note that in the embodiment, the width of the plurality of the first terminals Ta is equal to the width of the plurality of the second terminals Tb.

In the connecting portion in which the first wiring board 110 and the display panel 12 are connected, the display panel 12 includes an insulating substrate 12d, a first panel terminal Ta1 which is conductive and is disposed opposite the first terminal Ta, a second panel terminal Tb1 which is conductive and is disposed opposite the second terminal Tb, and a panel NC terminal Tnc1 which is conductive and is disposed opposite the NC terminal Tnc. The first panel terminals Ta1, the panel NC terminal Tnc1, and the second panel terminals Tb are arranged at a uniform pitch identical to the uniform pitch at which the terminals included in the first wiring board 110 are arranged.

The insulating substrate 12d is an insulator disposed at a surface of the back of a surface where the display 2 of the display panel 12 is disposed. Note that FIG. 5 and FIG. 6 schematically illustrate the vicinity of the connecting portion in which the first wiring board 110 and the display panel 12 are connected.

In addition, the display panel 12 and the first wiring board 110 are connected using, for example, an ACF (not illustrated).

Note that the second wiring board 120 has the same configuration as the first wiring board 110. The display panel 12 and the second wiring board 120 are connected using, for example, an ACF.

In addition, as illustrated in FIG. 6, the width L of each of the plurality of the first terminals Ta included in the first wiring board 110 in the arranging direction is greater than a space S between two adjacent first terminals Ta. Similarly, the width of each of the plurality of the second terminals Tb included in the first wiring board 110 in the arranging direction is greater than the space between two adjacent second terminals Tb. Furthermore, the width of each of the plurality of the first panel terminals Ta1 included in the display panel 12 in the arranging direction is also greater than the space between two adjacent first panel terminals Ta1, and the width of each of the plurality of the second panel terminals Tb1 included in the display panel 12 in the arranging direction is also greater than the space between two adjacent second panel terminals Tb1. That is to say, the width of the first terminal Ta in the arranging direction and the width of the second terminal Tb in the arranging direction are greater than half the uniform pitch. Accordingly, it is possible to reduce contact resistance present between the first terminal Ta and the second terminal Tb which are included in the first wiring board 110 and the first panel terminal Ta1 and the second panel terminal Tb1 which are included in the display panel 12.

1-4. Operation of First Wiring Board and Second Wiring Board

Next, operation of the first wiring board 110 and the second wiring board 120 according to the embodiment will be described.

As described above, since the display device 1 according to the embodiment includes the first wiring board 110 and the second wiring board 120 which are flexible, it is possible to make the display device 1 according to the embodiment thinner and lighter than the display device 1001 according to comparative example 1 illustrated in FIG. 3 is. However, since the size of the first wiring board 110 according to the embodiment is larger than the size of each of the first connection boards 131a to 131c according to comparative example 1, and the size of the second wiring board 120 according to the embodiment is larger than the size of each of the second connection boards 132a to 132c according to comparative example 1, the tolerances increase. Therefore, displacement between the display panel 12 and the first wiring board 110 may be greater than displacement between the display panel 12 and the first wiring board 1010 which are included in the display device 1001 in comparative example 1, and displacement between the display panel 12 and the second wiring board 120 may be greater than displacement between the display panel 12 and the second wiring board 1020 which are included in the display device 1001 in comparative example 1. A state of the connecting portion in which the first wiring board 110 and the display panel 12 are connected in the case of an occurrence of such displacement will be described with reference to FIG. 7 through FIG. 9.

Figure 7:
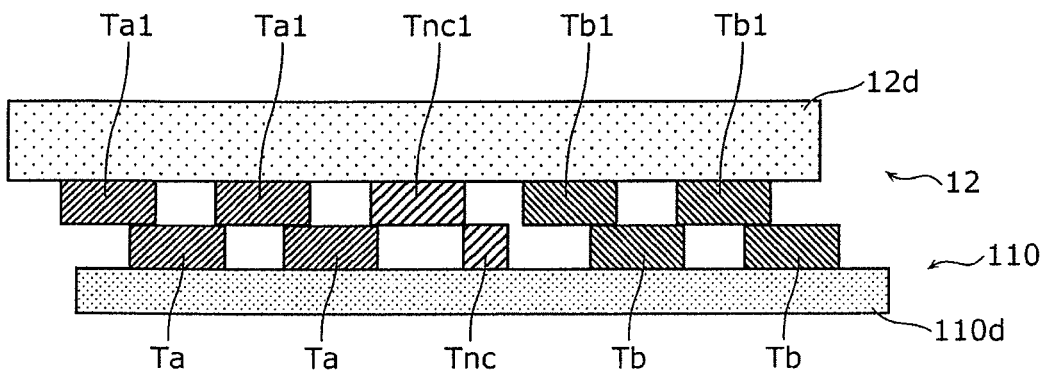
FIG. 7 is a schematic cross sectional view illustrating the connecting portion in which the first wiring board and the display panel according to Embodiment 1 are connected in the case of an occurrence of displacement between the first wiring board and the display panel.
Figure 8:
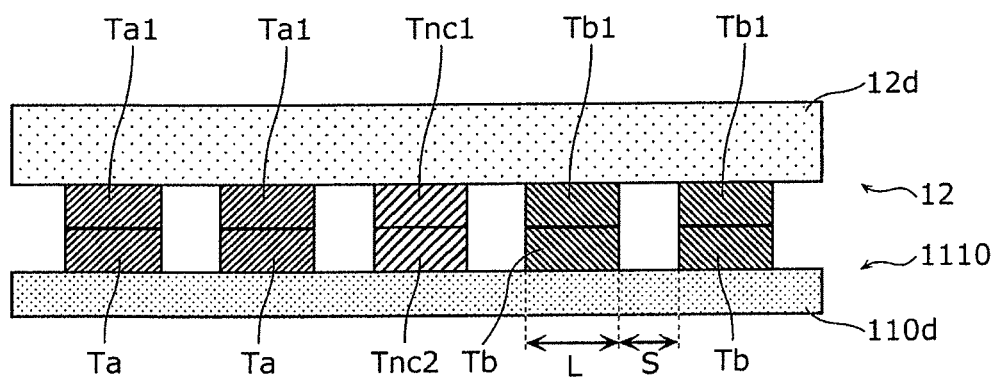
FIG. 8 is a schematic cross sectional view illustrating a connecting portion in which a first wiring board and a display panel according to comparative example 2 are connected in the case of no occurrence of displacement between the first wiring board and the display panel.
Figure 9:
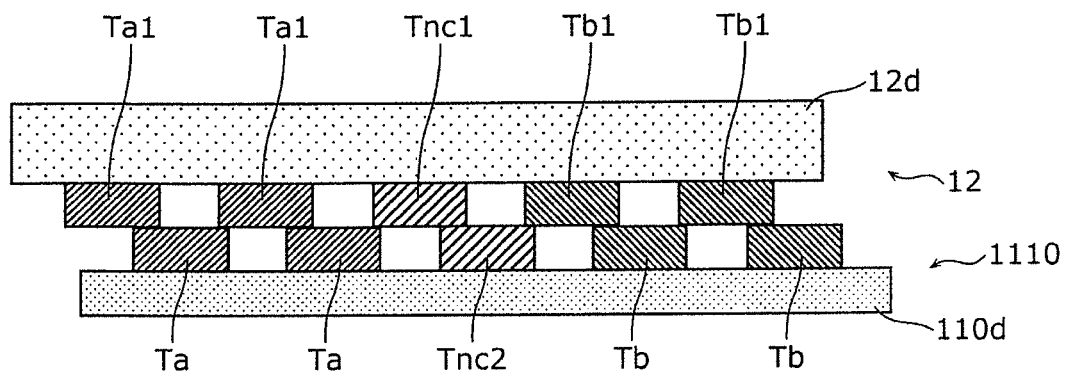
FIG. 9 is a schematic cross sectional view illustrating the connecting portion in which the first wiring board and the display panel according to comparative example 2 are connected in the case of an occurrence of displacement between the first wiring board and the display panel.

FIG. 7 is a schematic cross sectional view illustrating the connecting portion in which the first wiring board 110 and the display panel 12 according to the embodiment are connected in the case of an occurrence of displacement between the first wiring board 110 and the display panel 12. FIG. 8 is a schematic cross sectional view illustrating a connecting portion in which a first wiring board 1110 and a display panel 12 according to comparative example 2 are connected in the case of no occurrence of displacement between the first wiring board 1110 and the display panel 12. FIG. 9 is a schematic cross sectional view illustrating the connecting portion in which the first wiring board 1110 and the display panel 12 are connected in the case of an occurrence of displacement between the first wiring board 1110 and the display panel 12 according to comparative example 2. Note that cross sections illustrated in FIG. 7 through FIG. 9 are taken along the position identical to the position along which the cross section illustrated in FIG. 6 is taken.

The configuration of the first wiring board 1110 according to comparative example 2 which is illustrated in FIG. 8 and the configuration of the first wiring board 110 according to the embodiment are the same, except for the configuration of an NC terminal Tnc2. The width of the NC terminal Tnc2 included in the first wiring board 1110 according to comparative example 2 in the arranging direction in which the first terminal Ta, the NC terminal, and the second terminal Tb are arranged is identical to the width of the first Ta and the width of the second terminal Tb in the arranging direction. That is to say, the width of the NC terminal Tnc2 in the arranging direction is greater than the space between the NC terminal Tnc2 and the first terminal Ta and the space between the NC terminal Tnc2 and the second terminal Tb. For this, as illustrated in FIG. 9, when displacement occurs between the first wiring board 1110 and the display panel 12 according to comparative example 2, a short circuit occurs between the first terminal Ta and the panel NC terminal Tnc1 included in the display panel 12 and between the first terminal Ta and the second terminal Tb via the NC terminal Tnc2 included in the first wiring board 1110.

On the contrary, when the first wiring board 110 according to the embodiment is used, the width of the NC terminal Tnc in the arranging direction is smaller than that of the other terminals in the arranging direction. For this, as illustrated in FIG. 7, the width of the first terminal Ta in the arranging direction and the second terminal Tb in the arranging direction are greater than half the uniform pitch. In addition, even when displacement occurs between the first wiring board 110 and the display panel 12, it is possible to reduce the occurrences of short circuits between the NC terminal Tnc and the first terminal Ta that is adjacent to the NC terminal Tnc, via, for example, the panel NC terminal Tnc1 which is disposed opposite the NC terminal Tnc, and the occurrences of short circuits between the NC terminal and the second terminal Tb that is adjacent to the NC terminal Tnc, via, for example, the panel NC terminal Tnc1 which is disposed opposite the NC terminal Tnc. Therefore, it is possible to reduce the occurrences of short circuits between the first terminal Ta and the second terminal Tb.

In addition, in the embodiment, the width of the NC terminal Tnc in the arranging direction is less than half the pitch at which the first terminals Ta, the NC terminal Tnc, and the second terminals Tb are arranged. With this, it is possible to assuredly reduce the occurrences of short circuits between the NC terminal Tnc and the first terminal Ta that is adjacent to the NC terminal Tnc, via, for example, the panel NC terminal Tnc1 which is disposed opposite the NC terminal Tnc, and the occurrences of short circuits between the NC terminal Tnc and the second terminal Tb that is adjacent to the NC terminal Tnc, via, for example, the panel NC terminal Tnc1 which is disposed opposite the NC terminal Tnc.

In addition, when a first voltage is applied to the first terminal Ta, and a second voltage that is different from the first voltage is applied to the second terminal Tb, it is possible to reduce the flow of an overcurrent between the first terminal Ta and the second terminal Tb due to an occurrence of a short circuit between the first terminal Ta and the second terminal Tb.

In addition, the width of the NC terminal Tnc in the arranging direction may be smaller than the space between the panel NC terminal Tnc1 and the first panel terminal Ta1 which are included in the display panel 12 and the space between the panel NC terminal Tnc1 and the second panel terminal Tb1 which are included in the display panel 12. With this, it is possible to more assuredly reduce the occurrences of short circuits between the first terminal Ta and the second terminal Tb.

1-5. Conclusion

As has been described above, the first wiring board 110 according to the embodiment includes: the insulating substrate 110d which is flexible; the first terminal Ta which is conductive and is disposed on the insulating substrate 110d; the second terminal Tb which is conductive and is disposed on the insulating substrate 110d; and the NC terminal Tnc which is conductive and is disposed on the insulating substrate 110d between the first terminal Ta and the second terminal Tb. In the first wiring board 110 according to the embodiment, the first terminal Ta, the NC terminal Tnc, and the second terminal Tb are arranged at a uniform pitch in an arranging direction that is predetermined, and a width of the NC terminal Tnc in the arranging direction is smaller than a width of the first terminal Ta in the arranging direction and a width of the second terminal Tb in the arranging direction.

As such, since the width of the NC terminal Tnc in the arranging direction is smaller than the widths of the other terminals, even when the displacement occurs between the first wiring board 110 and the display panel 12 with which the first wiring board 110 is connected, it is possible to reduce the occurrences of short circuits between the NC terminal Tnc and the first terminal Ta that is adjacent to the NC terminal Tnc, via, for example, the panel NC terminal Tnc1 which is disposed opposite the NC terminal Tnc, and the occurrences of short circuits between the NC terminal Tnc and the second terminal Tb that is adjacent to the NC terminal Tnc, via, for example, the panel NC terminal Tnc1 which is disposed opposite the NC terminal Tnc. Therefore, it is possible to reduce the occurrences of short circuits between the first terminal Ta and the second terminal Tb.

In addition, in the first wiring board 110, the width of the NC terminal Tnc in the arranging direction is less than half the uniform pitch.

With this, it is possible to more assuredly reduce the occurrences of short circuits between the NC terminal Tnc and the first terminal Ta that is adjacent to the NC terminal Tnc, via, for example, the panel NC terminal Tnc1 which is disposed opposite the NC terminal Tnc, and the occurrences of short circuits between the NC terminal Tnc and the second terminal Tb that is adjacent to the NC terminal Tnc, via, for example, the panel NC terminal Tnc1 which is disposed opposite the NC terminal Tnc.

In addition, in the first wiring board 110, the width of the first terminal Ta in the arranging direction and the width of the second terminal Tb in the arranging direction are greater than half the uniform pitch.

Accordingly, it is possible to reduce contact resistance present between the first terminal Ta and the first panel terminal Ta1 with which the first terminal Ta is connected and contact resistance present between the second terminal Tb and the second panel terminal Tb1 with which the second terminal Tb is connected.

In addition, in the first wiring board 110, a first voltage is applied to the first terminal Ta, a second voltage that is different from the first voltage is applied to the second terminal Tb, and the NC terminal Tnc is maintained in a floating state.

As such, since the occurrence of a short circuit between the first terminal Ta and the second terminal Tb is reduced even when a different voltage is applied to each of the first terminal Ta and the second terminal Tb, it is possible to reduce the flow of an overcurrent between the first terminal Ta and the second terminal Tb.

In addition, the display device 1 according to the embodiment includes the first wiring board 110 and the display panel 12 with which the first wiring board 110 is connected. The display panel 12 includes: the first panel terminal Ta1 which is conductive and is disposed opposite the first terminal Ta; the second panel terminal Tb1 which is conductive and is disposed opposite the second terminal Tb; and the panel NC terminal Tnc1 which is conductive and is disposed opposite the NC terminal Tnc. The first panel terminal Ta1, the panel NC terminal Tnc1, and the second panel terminal Tb1 are arranged, in the arranging direction, at the uniform pitch identical to the uniform pitch at which the first terminal Ta, the NC terminal Tnc, and the second terminal Tb are arranged.

According to such display device 1, in the connecting portion in which the first wiring board 110 and the display panel 12 are connected, it is possible to reduce the occurrences of short circuits between the NC terminal Tnc and the first terminal Ta, via, for example, the panel NC terminal Tnc1, and the occurrence of a short circuit between the NC terminal Tnc and the second terminal Tb, via, for example, the panel NC terminal Tnc1. Therefore, it is possible to reduce the occurrences of short circuits between the first terminal Ta and the second terminal Tb.

Embodiment 2

A flexible wiring board and a display device according to Embodiment 2 will be described. The configuration of the flexible wiring board according to this embodiment and the configuration of the flexible wiring board according to Embodiment 1 are the same, except that the flexible wiring board according to this embodiment does not include an NC terminal. Hereinafter, the flexible wiring board and the display device according to the embodiment will be described with reference to FIG. 10 and FIG. 11.

Figure 10:
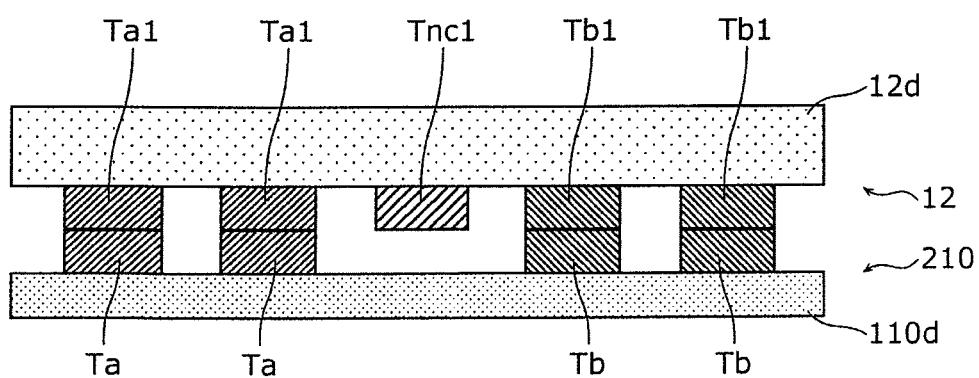
FIG. 10 is a schematic cross sectional view illustrating a connecting portion in which a first wiring board and a display panel according to Embodiment 2 are connected in the case of no occurrence of displacement between the first wiring board and the display panel.
Figure 11:
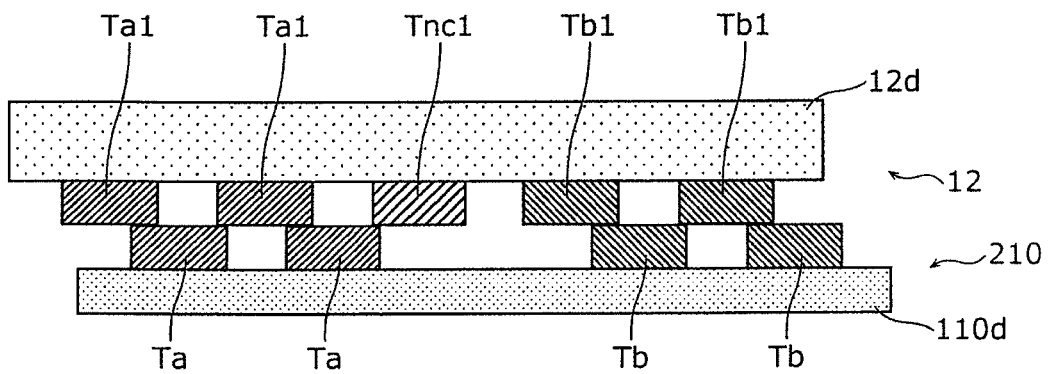
FIG. 11 is a schematic cross sectional view illustrating the connecting portion in which the first wiring board and the display panel according to Embodiment 2 are connected in the case of an occurrence of displacement between the first wiring board and the display panel.

FIG. 10 is a schematic cross sectional view illustrating a connecting portion in which a first wiring board 210 and a display panel 12 are connected in the case of no occurrence of displacement between the first wiring board 210 and the display panel 12 according to the embodiment. FIG. 11 is a schematic cross sectional view illustrating the connecting portion in which the first wiring board 210 and the display panel 12 are connected in the case of an occurrence of displacement between the first wiring board 210 and the display panel 12 according to the embodiment.

The display device according to the embodiment includes the first wiring board 210 and the display panel 12 as illustrated in FIG. 10 and FIG. 11.

The first wiring board 210 illustrated in FIG. 10 and FIG. 11 is an example of the flexible wiring board according to the embodiment. The first wiring board 210 is a flexible wiring board connected with the display panel 12. The display panel 12 includes a first panel terminal Ta1 that is conductive, a second panel terminal Tb1 that is conductive, and a panel NC terminal Tnc1 which is conductive and is disposed between the first panel terminal Ta1 and the second panel terminal Tb1. The first panel terminal Ta1, the panel NC terminal Tnc1 and the second terminal Tb1 are arranged at a uniform pitch in an arranging direction that is predetermined.

The first wiring board 210 includes an insulating substrate 110d which is flexible, a first terminal Ta which is conductive and is disposed on the insulating substrate 110d, and a second terminal Tb which is conductive and is disposed on the insulating substrate 110d. The first terminal Ta is connected with the first panel terminal Ta1, and the second terminal Tb is connected with the second panel terminal Tb1. The flexible wiring board includes a surface between the first terminal and the second terminal, the surface being entirely formed using an insulating material. In other words, there is no conductor like the NC terminal Tnc according to Embodiment 1 disposed between the first terminal Ta and the second terminal Tb which are included in the first wiring board 210.

In the embodiment, the first wiring board 210 includes a plurality of the first terminals Ta and a plurality of the second terminals Tb. The plurality of the first terminals Ta and the plurality of the second terminals Tb are arranged at the uniform pitch in the arranging direction. The uniform pitch is equal to the pitch at which the first panel terminal Ta1, the panel NC terminal Tnc1, and the second panel terminal Tb1 which are included in the display panel 12 are arranged. The center-to-center distance between the first terminal Ta disposed closest to the second terminal Tb, and the second terminal Tb disposed closest to the first terminal Ta is twice the uniform pitch.

The configuration of the first wiring board 210 as described above makes it possible to reduce the occurrences of short circuits between the first terminal Ta and the second terminal Tb which are adjacent, even when displacement occurs between the first wiring board 210 and the display panel 12 as illustrated in FIG. 11.

Other Variations, Etc

The flexible wiring board and the display device according to the present disclosure have been described based on the exemplary embodiments. However, the flexible wiring board and the display device according to the present disclosure are not limited to these exemplary embodiments. A different embodiment achieved by combining optional elements according to the exemplary embodiments, a variation obtained, without departing from the scope of the present disclosure, by making to the embodiments various modifications which may be conceived by a person skilled in the art, and various devices that includes the display device according to the exemplary embodiments are also included in the present disclosure.

Figure 12:
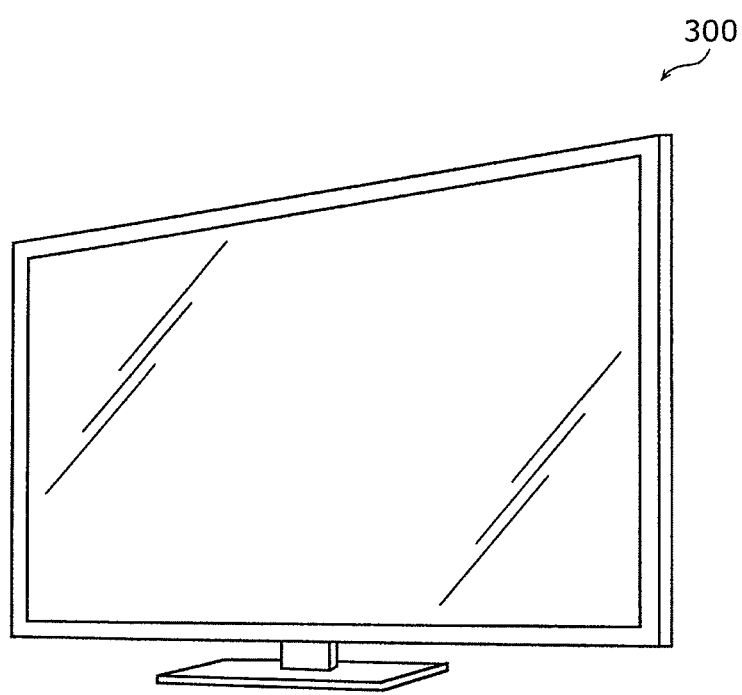
FIG. 12 is a diagram illustrating an external appearance of a thin flat screen TV that includes the display device according to the embodiments.

For example, the display device according to the above-described embodiments is included in a thin flat TV 300 as illustrated in FIG. 12. With the display device according to the above-described embodiments, a thin flat TV which is thinned and lightened can be realized.

In addition, although the above-described embodiments described the configuration in which a flexible wiring board is used for each of the first wiring board and the second wiring board, the flexible wiring board is applicable to other wiring boards, such as the first video wiring board and the second video wiring board.

In addition, although the circuit board includes the first wiring board and the second wiring board in the above-described embodiments, the number of wiring board which supplies a power supply voltage to the display panel 12 is not limited to the two wiring boards. The number of the wiring board may be three or more. In this case, the circuit board may include three or more cables each of which connects the power supply wiring board 100 and each wiring board.

In addition, although the first wiring board and the second wiring board are disposed at the upper edge of the display panel 12 in the above-described embodiments, the first wiring board and the second wiring board may be disposed at the lower edge of the display panel 12. In addition, although the first video wiring board 170 and the second video wiring board 180 are disposed at the lower edge of the display panel 12 in the above-described embodiments, the first video wiring board 170 and the second video wiring board 180 may be disposed at the upper edge of the display panel 12.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful for an organic EL flat-panel display and is particularly suitable for use in a large-sized display whose thinning and lightening are particularly in demand.

The invention claimed is:

1. A flexible wiring board, comprising:
an insulating substrate which is flexible;
a plurality of first conductive terminals disposed along an edge of the insulating substrate;
a plurality of second conductive terminals disposed along the edge of the insulating substrate; and
a single conductive no-connection (NC) terminal disposed on the edge of the insulating substrate between the plurality of first terminals and the plurality of second terminals, wherein
the plurality of first terminals, the NC terminal, and the plurality of second terminals are arranged at a uniform pitch in an arranging direction that is a direction in which the edge extends,
a width of the NC terminal in the arranging direction is smaller than a width of each of the plurality of first terminals in the arranging direction and a width of each of the plurality of second terminals in the arranging direction, a first voltage is applied to the plurality of first terminals, a second voltage that is different from the first voltage is applied to the plurality of second terminals, and the NC terminal is maintained in a floating state.

2. The flexible wiring board according to claim 1, wherein the width of the NC terminal in the arranging direction is less than half the uniform pitch.

3. The flexible wiring board according to claim 1, wherein the width of each of the plurality of first terminals in the arranging direction and the width of each of the plurality of second terminals in the arranging direction are greater than half the uniform pitch.

4. A display device, comprising:

the flexible wiring board according to claim 1; and a display panel with which the flexible wiring board is connected, wherein the display panel includes:

a plurality of first conductive panel terminals disposed opposite the plurality of first terminals;

a plurality of second conductive panel terminals disposed opposite the plurality of second terminals; and a single conductive panel NC terminal disposed opposite the NC terminal, and the plurality of first panel terminals, the panel NC terminal, and the plurality of second panel terminals are arranged at the uniform pitch in the arranging direction.

5. A flexible wiring board that is connected with a display panel, wherein the display panel includes:

a plurality of first panel terminals that are conductive;

a plurality of second panel terminals that are conductive; and a single panel no-connection (NC) terminal which is conductive and is disposed between the plurality of first panel terminals and the plurality of second panel terminals, and the first panel terminal terminals, the panel NC terminal, and the second panel terminals are arranged at a uniform pitch in an arranging direction that is predetermined, and the flexible wiring board comprises:

an insulating substrate which is flexible;

a plurality of first conductive terminals disposed along an edge of the insulating substrate extending in the arranging direction, the plurality of first terminals being connected with the plurality of first panel terminals; and a plurality of second conductive terminals disposed along the edge of the insulating substrate, the plurality of second terminals being connected with the plurality of second panel terminals, and the flexible wiring board includes a surface between the plurality of first terminals and the plurality of second terminals, the surface being entirely formed using an insulating material, a first voltage is applied to the plurality of first terminals, a second voltage that is different from the first voltage is applied to the plurality of second terminals, and a distance between the plurality of first terminals and the plurality of second terminals is twice the uniform pitch.

6. A display device, comprising:

the flexible wiring board according to claim 5; and the display panel.

* * * * *